United States Patent
Gasper, Jr. et al.

(10) Patent No.: US 7,712,066 B2
(45) Date of Patent: May 4, 2010

(54) AREA-EFFICIENT POWER SWITCHING CELL

(75) Inventors: Martin J. Gasper, Jr., Zionsville, PA (US); James C. Parker, Upper Milford Township, Lehigh County, PA (US); Clayton E. Schneider, Jr., Bethlehem, PA (US)

(73) Assignee: Agere Systems, Inc., Allentown, PA (US)

( * ) Notice: Subject to any disclaimer, the term of this patent is extended or adjusted under 35 U.S.C. 154(b) by 366 days.

(21) Appl. No.: 11/322,103

(22) Filed: Dec. 29, 2005

(65) Prior Publication Data

US 2007/0164806 A1    Jul. 19, 2007

(51) Int. Cl.
*G06F 9/45*    (2006.01)
*G06F 17/50*   (2006.01)
*G06F 7/38*    (2006.01)
*H03K 19/173*  (2006.01)

(52) U.S. Cl. ............... 716/10; 257/207; 326/38
(58) Field of Classification Search ............ None
See application file for complete search history.

(56) References Cited

U.S. PATENT DOCUMENTS 5,594,371 A * 1/1997 Douseki ............... 326/119
6,310,487 B1 * 10/2001 Yokomizo ............. 324/769
6,384,674 B2 * 5/2002 Tanizaki et al. ........ 327/544
6,529,042 B1 * 3/2003 Hiramoto et al. ........ 326/83
6,635,934 B2 * 10/2003 Hidaka ................ 257/369
7,202,700 B2 * 4/2007 Isono .................. 326/81
2004/0070427 A1 * 4/2004 Miyagi ................ 327/100
2007/0168899 A1 * 7/2007 Frenkil ................ 716/10

* cited by examiner

*Primary Examiner*—Rexford N Barnie
*Assistant Examiner*—Dylan White
(74) *Attorney, Agent, or Firm*—Ryan, Mason & Lewis, LLP

(57) ABSTRACT

A power switching circuit is provided for use in an integrated circuit including at least a first voltage rail and a second voltage rail. The power switching circuit includes at least one MOS device having a first source/drain adapted for connection to the first voltage rail, a second source/drain adapted for connection to the second voltage rail, and a gate adapted for receiving a control signal. The MOS device selectively connects the first voltage rail to the second voltage rail in response to the control signal. The first and second voltage rails form a grid overlying the power switching circuit, the first and second voltage rails being formed in different planes relative to one another. The connection between the power switching circuit and the first voltage rail is made at an interface between the first and voltage rails.

17 Claims, 3 Drawing Sheets

AREA-EFFICIENT POWER SWITCHING CELL

FIELD OF THE INVENTION

The present invention relates generally to electronic circuits, and more particularly relates to power switching cells.

BACKGROUND OF THE INVENTION

In order to reduce overall power consumption in a circuit, it is well known to scale the supply voltage. However, reducing the supply voltage of the circuit leads to lowering the speed of metal-oxide-semiconductor (MOS) devices in the circuit. In order to maintain circuit performance, MOS device threshold voltages ($V_t$) must scale with the supply voltage, which will cause subthreshold leakage currents to increase exponentially. Multiple-threshold complementary metal-oxide-semiconductor (MTCMOS) circuit architectures have been demonstrated as an effective technique for reducing leakage currents during a standby state by employing high threshold voltage "sleep" devices to gate one or more voltage supplies (e.g., VDD, ground, etc.) of a logic block employing low threshold voltage devices.

FIG. 1 shows a typical MTCMOS circuit implementation, wherein a logic cell 102 including low threshold voltage devices is connected between a voltage supply rail, VDD, and a virtual ground, VGND, and a high threshold voltage switching cell comprising an n-channel MOS (NMOS) device, MSLP, is connected between the virtual ground VGND and an actual ground rail, GND. Device MSLP is gated by a control signal, $\overline{\text{SLEEP}}$, which turns off MSLP during a standby mode to reduce leakage currents generated by the logic cell 102 by isolating the logic cell from the actual ground rail.

Conventional MTCMOS circuit implementations typically utilize switching cells which are in-line with standard logic cells to connect the virtual ground to the actual ground rail. Using this layout approach, however, requires that both the virtual ground and the actual ground rail be carried throughout the standard logic cells, resulting in a silicon area penalty for essentially the entire standard logic cell library.

Accordingly, there exists a need for an improved power switching cell arrangement which does not suffer from one or more of the problems exhibited by conventional power switching cell arrangements.

SUMMARY OF THE INVENTION

The present invention meets the above-noted need by providing, in an illustrative embodiment, an improved power switching cell configuration which is located under an overlying power grid. A connection to the actual ground rail is made vertically between the overhead grid and a single ground rail for the logic cells. This arrangement advantageously allows two-rail standard cell libraries to be used in a switched supply MTCMOS architecture, thereby providing a more area-efficient circuit implementation.

In accordance with one aspect of the invention, a power switching circuit is provided for use in an integrated circuit including at least a first voltage rail and a second voltage rail. The power switching circuit includes at least one MOS device having a first source/drain adapted for connection to the first voltage rail, a second source/drain adapted for connection to the second voltage rail, and a gate adapted for receiving a control signal. The MOS device selectively connects the first voltage rail to the second voltage rail in response to the control signal. The first and second voltage rails form a grid overlying the power switching circuit, the first and second voltage rails being formed in different planes relative to one another. The connection between the power switching circuit and the first voltage rail is made at an interface between the first and voltage rails.

In accordance with another aspect of the invention, a MTCMOS circuit includes at least first, second and third voltage rails, the third voltage rail being formed in a different plane relative to the first and second voltage rails. The MTCMOS circuit further includes logic circuitry connected between the first and second voltage rails, and a power switching circuit connected between the second and third voltage rails. The power switching circuit includes an input adapted for receiving a control signal. The power switching circuit is operative to selectively connect the second voltage rail to the third voltage rail in response to the control signal. The connection between the power switching circuit and the third voltage rail is made at an interface between the second and third voltage rails.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative IC layouts of a power switching cell for use, for example, in a MTCMOS circuit architecture. It should be understood, however, that the present invention is not limited to these or any other particular layouts. Rather, the invention is more generally applicable to techniques for providing an area-efficient power switching cell layout. Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
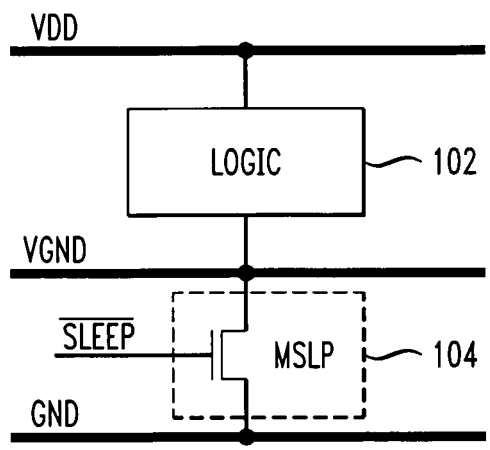
FIG. 1 is a schematic diagram depicting a MTCMOS circuit implementation including a power switching cell connected between a virtual ground and an actual ground rail.

As previously stated, FIG. 1 shows a typical MTCMOS circuit implementation, wherein a logic cell 102 is connected between a voltage supply rail, VDD, and a virtual ground, VGND, and a power switching cell 104 comprising at least one high threshold voltage NMOS device, MSLP, is connected between the virtual ground VGND and an actual ground rail, GND. Generally, low threshold voltage devices are considerably faster than high threshold voltage devices. As a tradeoff, however, the low threshold voltage devices generally exhibit higher leakage currents compared to high threshold voltage devices. In order to meet certain speed requirements, standard logic cells typically use low threshold voltage devices. These logic cells are gated off during a standby mode of operation in order to reduce leakage currents. Device MSLP is gated by a control signal, $\overline{\text{SLEEP}}$ which turns off MSLP during the standby mode of operation to reduce leakage currents generated by the logic cell 102 by isolating the logic cell from the actual ground rail GND. A similar power switching circuit arrangement can be used in addition to or in place of the circuit arrangement shown in FIG. 1 to gate the voltage supply VDD to the logic cell 102. Since speed is typically not of concern in the power switching cell 104, high threshold voltage devices, which exhibit significantly lower leakage currents compared to low threshold voltage devices, are generally employed in the power switching cell.

Figure 2A:
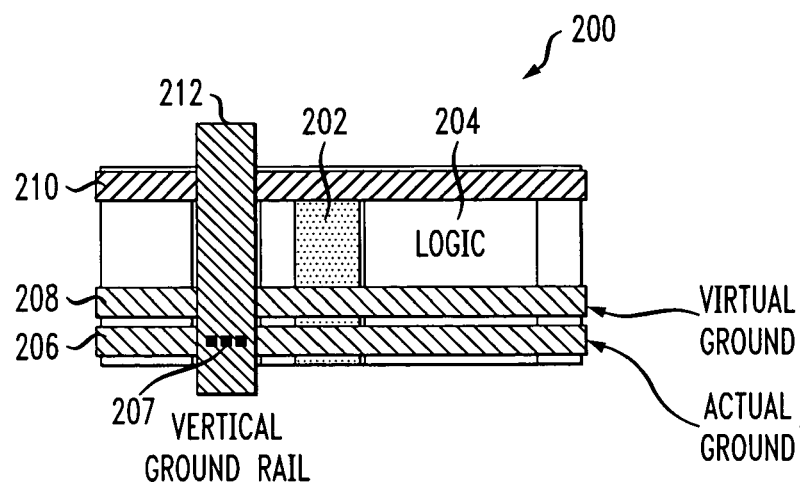
FIGS. 2A and 2B are top plan views depicting at least a portion of an illustrative integrated circuit (IC) layout including a power switching cell and a logic cell located in-line with the power switching cell.
Figure 2B:
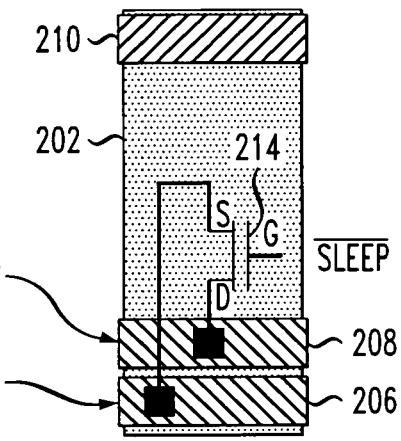

FIGS. 2A and 2B are top plan views depicting at least a portion of an illustrative IC layout 200 including a power switching cell 202 and a logic cell 204 located in-line with the power switching cell. FIG. 2B is close-up view of the logic cell 202. The layout 200 further includes an actual ground rail 206, a virtual ground rail 208 and a voltage supply rail 210 arranged substantially parallel to one another and in a substantially horizontal orientation. A vertical ground rail 212 may also be included. The vertical ground rail 212 may be electrically connected to the actual ground rail 206 by way of one or more conductive vias 207 for interconnecting the actual ground rail to other regions in the IC. The vertical ground rail 212 may be arranged substantially orthogonal to the actual ground rail 206 and in a substantially vertical orientation as shown. The actual ground rail 206, virtual ground rail 208, and voltage supply rail 210 may be fabricated using a lower level metal (e.g., metal 1 (M1) layer) in a same plane. The vertical ground rail 212, which crosses over the actual ground rail 206, virtual ground rail 208, and voltage supply rail 210, is preferably fabricated using a higher level metal (e.g., metal 2 (M2) layer) in a different plane than the actual ground rail, virtual ground rail, and voltage supply rail. In this manner, the vertical ground rail 212 is electrically isolated from the actual ground rail 206, virtual ground rail 208, and voltage supply rail 210.

With reference to FIG. 2B, the power switching cell 202 includes at least one MOS switching device, such as NMOS device 214, having a source (S) connected to the actual ground rail 206, a drain (D) connected to the virtual ground rail 208, and a gate (G) for receiving a control signal, $\overline{\text{SLEEP}}$, for selectively turning device 214 on and off. The NMOS device 214 functions primarily to selectively connect the virtual ground rail 208 to the actual ground rail 206 during normal operation of the logic cell. Thus, in the illustrative power switching circuit 202, under normal operation of the logic cell 204 the control signal $\overline{\text{SLEEP}}$ will be a logic high ("1") level (e.g., inactive) and during a standby mode of operation, the control signal $\overline{\text{SLEEP}}$ will be a logic low ("0") level (e.g., active).

It is to be appreciated that, because a MOS device is symmetrical in nature, and thus bidirectional, the assignment of source and drain designations in the MOS device is essentially arbitrary. Therefore, the source and drain of a given device may be referred to herein generally as first and second source/drains, respectively, where the term "source/drain" in this context denotes a source or a drain of the device.

Since the power switching cell 202 requires both the actual ground rail 206 and virtual ground rail 208, and since the logic cell 204 is placed in-line with the power switching cell, the logic cell also requires that the actual and virtual ground rails pass through the cell, along with the voltage supply rail 210. This requires modification of the standard cell library, which typically only accommodates a voltage supply rail and an actual ground rail. Moreover, the inclusion of both actual and virtual ground rails in the logic cell 204 undesirably increases the chip area of the logic cell. This area penalty is essentially carried throughout the entire logic cell library.

Figure 3A:
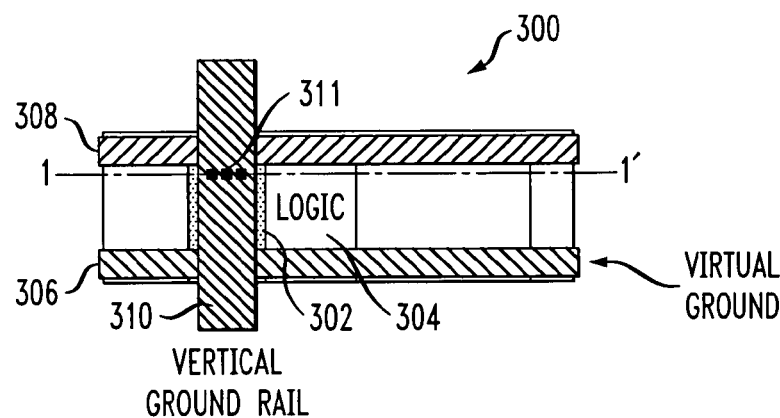
FIGS. 3A and 3B are top plan views depicting at least a portion of an exemplary IC layout, formed in accordance with one aspect of the present invention.
Figure 3B:
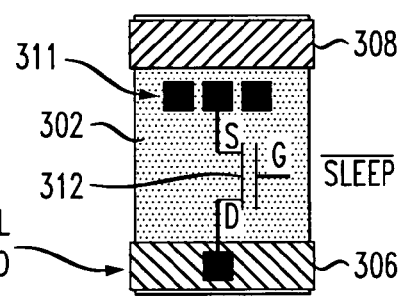

FIGS. 3A and 3B are top plan views depicting at least a portion of an exemplary IC layout 300, formed in accordance with one aspect of the present invention. The exemplary layout 300 is suitable for use, for example, with a MTCMOS circuit implementation. It is to be understood that the invention is not limited to the particular IC layout shown, and that alternative layout configurations are similarly contemplated, as will become apparent to those skilled in the art. The exemplary layout 300 includes a power switching cell 302 and at least one logic cell 304 located in-line with the power switching cell. The layout 300 further includes a virtual ground rail 306 and a voltage supply rail 308 arranged substantially parallel to one another in a substantially horizontal (e.g., row) orientation. A vertical ground rail, which in this embodiment functions as an actual ground rail 310, is also included in the layout 300. The actual ground rail 310 may be arranged substantially orthogonal to the virtual ground rail 306 and voltage supply rail 308 in a substantially vertical (e.g., column) orientation as shown. Alternatively, the actual ground rail 310 may be oriented in a different direction relative to the virtual ground rail 306 and voltage supply rail 308, such as diagonally.

The term "rail" as used herein is intended to refer to any conductive structure, including, but not limited to, a bus, trace, wire, conductor, etc., which can be used for providing electrical connection between two or more nodes in a circuit. In a more general sense, the virtual ground rail 306 may be referred to herein as a first voltage conductor, the actual ground rail 310 may be referred to as a second voltage conductor and the actual voltage supply rail 308 may be referred to as a third voltage conductor.

The virtual ground rail 306 and voltage supply rail 308 may be fabricated using a lower level conductor, such as, for example, a metal 1 (M1) layer, and the actual ground rail 310, which may cross over the virtual ground rail and/or the voltage supply rail at periodic intervals, is preferably fabricated using a higher level conductor, such as, for example, a metal 2 (M2) or metal 3 (M3) layer. Alternatively, virtual ground rail 306 and voltage supply rail 308 may be fabricated using a higher metal layer (e.g., M2) than the actual ground rail 310. The different metal layers (e.g., M1 and M2) in an IC are typically isolated from one another, such as, for example, by a layer of oxide (e.g., silicon dioxide), or an alternative insulating material (e.g., silicon nitride). Consequently, the actual ground rail 310 will be electrically isolated from the virtual ground rail 306 and voltage supply rail 308. Typically, the ground rail in a given IC is formed in one direction (e.g., horizontally) and the voltage supply rail is formed overlaying the ground rail using a different metal layer and in a different direction relative to the ground rail (e.g., vertically) so as to conserve IC area. This is sometimes referred to as an overlaying power grid.

With reference to FIG. 3B, the power switching cell 302 preferably includes a MOS switching device, such as NMOS device 312, having a source (S) adapted for connection to the actual ground rail 310, a drain (D) adapted for connection to the virtual ground rail 306, and a gate (G) adapted for receiving a control signal, $\overline{SLEEP}$, for selectively turning NMOS device 312 on and off. Device 312 functions primarily as a switch which connects the virtual ground rail 306 to the actual ground rail 310 during a first mode of operation of the logic cell 304, which may be a normal mode, and to disconnect the virtual ground rail 306 from the actual ground rail 310 during a second mode of operation, which may be a standby mode. Thus, in the illustrative power switching circuit 302, under normal operation of the logic cell 304 the control signal $\overline{SLEEP}$ will be a logic high ("1") level (e.g., inactive) and during a standby mode of operation, the control signal $\overline{SLEEP}$ will be a logic low ("0") level (e.g., active).

In accordance with an important aspect of the invention, the power switching cell 302 is preferably located under at least a portion of the overlying actual ground rail 310. With the power switching cell 302 configured under the overlying actual ground rail 310, electrical connection between the power switching cell and the actual ground rail can be made vertically, for example by way of one or more conductive vias 311. The connection between the power switching cell 302 and the actual ground rail 310 is preferably made at an interface of the actual ground rail and the virtual ground rail 306, as shown.

Figure 4:
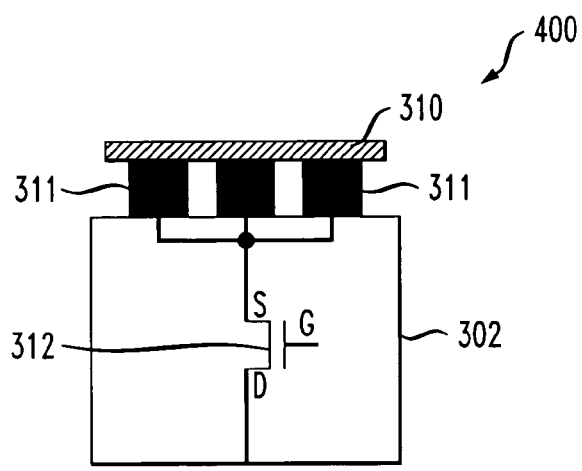
FIG. 4 is a cross-sectional view depicting at least a portion of the exemplary IC layout shown in FIG. 3A taken along line 1-1'.

FIG. 4 is a cross-sectional view 400 depicting at least a portion of the exemplary IC layout 300 shown in FIG. 3A taken along line 1-1'. With the power switching cell 302 configured in the manner shown, the need for an additional horizontal ground rail in the IC is beneficially eliminated, thereby reducing the overall size of the IC device. This area savings is advantageously carried throughout the entire logic cell library. Using this approach, the ground rail in a two-rail logic cell will serve as the virtual ground rail in a MTCMOS circuit implementation. Thus, by locating the power switching cell 302 substantially under at least a portion of the overlying actual ground rail 310 so as to permit the connection to the actual and virtual ground rails to be made at an interface of overlapping conductive (e.g., metal) layers corresponding to the actual and virtual ground rails, an MTCMOS circuit can be implemented using standard two-rail logic cell libraries.

It is to be appreciated that the techniques of the present invention are similarly suitable for use in a MTCMOS circuit employing at least one power switching cell connected between a voltage supply rail and a virtual voltage supply rail, as will be described herein below in conjunction with FIGS. 5, 6A and 6B. This power switching circuit arrangement can be used in addition to or in place of the circuit arrangement shown in FIGS. 3A and 3B to gate the supply voltage (e.g., VDD) to the logic cell, in accordance with another aspect of the invention.

Figure 5:
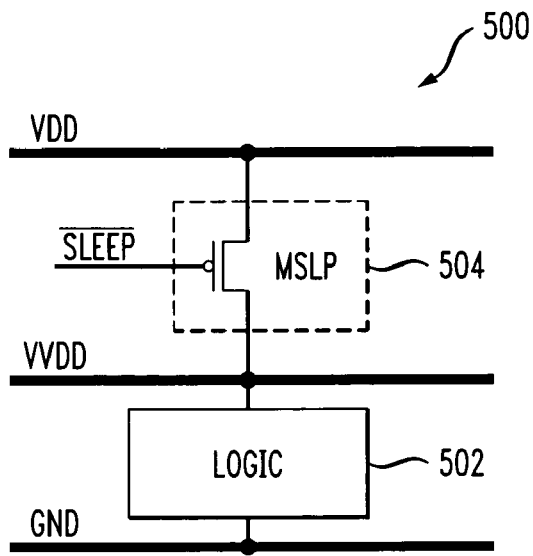
FIG. 5 is a schematic diagram depicting a MTCMOS circuit implementation including a power switching cell connected between a virtual voltage supply and an actual voltage supply rail.

With reference to FIG. 5, an exemplary MTCMOS circuit 500 is shown including a logic cell 502 connected between a ground rail, GND, and a virtual voltage supply rail, VVDD, and a power switching cell 504 connected between the virtual voltage supply rail VVDD and an actual voltage supply rail, VDD. Generally, low threshold voltage devices, which are considerably faster than high threshold voltage devices, are employed in the logic cell 502. As previously stated, however, the low threshold voltage devices generally exhibit higher leakage currents compared to high threshold voltage devices. Since speed is typically not of concern in the power switching cell 504, high threshold voltage devices are preferably employed in the power switching cell. Power switching cell 504 preferably includes at least one MOS device, such as PMOS device MSLP, having a source adapted for connection to the actual voltage supply rail VDD, a drain connected to the virtual voltage supply rail VVDD, and a gate adapted for receiving a control signal, SLEEP. Device MSLP is gated by the control signal SLEEP, which turns off MSLP during a standby mode of operation to reduce leakage currents generated by the logic cell 502 by isolating the logic cell from the actual voltage supply rail VDD. Since a PMOS device is employed in the power switching cell 504 in this instance rather than an NMOS device, the control signal SLEEP gating the device is preferably a logical complement of the control signal $\overline{SLEEP}$ used to gate the power switching cell 104 depicted in FIG. 1.

Figure 6A:
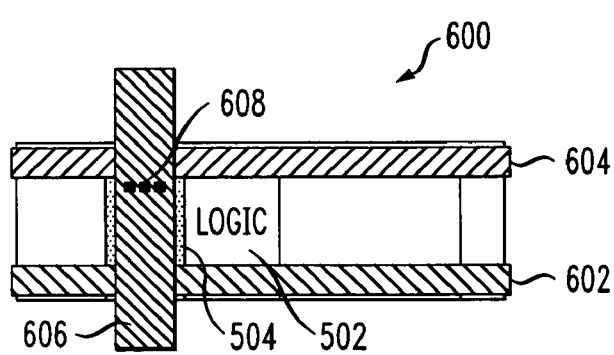
FIGS. 6A and 6B are top plan views depicting at least a portion of an exemplary IC layout, formed in accordance with another aspect of the present invention.
Figure 6B:
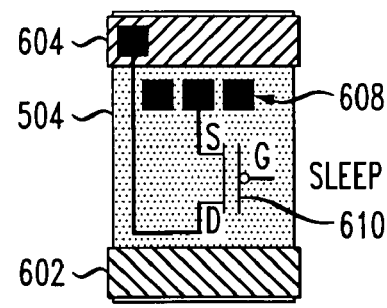

FIGS. 6A and 6B are top plan views depicting at least a portion of an exemplary IC layout 600, formed in accordance with another aspect of the present invention. The exemplary layout 600 includes power switching cell 504 and at least one logic cell 502 located in-line with the power switching cell. The layout 600 further includes a ground rail 602 and a virtual voltage supply rail 604 arranged substantially parallel to one another in a substantially horizontal orientation. A vertical voltage supply rail, which in this embodiment functions as an actual voltage supply rail 606, is also included in the layout 600. The actual voltage supply rail 606 may be arranged substantially orthogonal to the ground rail 602 and virtual voltage supply rail 604 in a substantially vertical orientation as shown. Alternatively, the actual voltage supply rail 606 may be oriented in a different direction relative to the ground rail 602 and virtual voltage supply rail 604, such as diagonally.

The ground rail 602 and virtual voltage supply rail 604 are preferably fabricated using a different conductive layer than the actual voltage supply rail 606. For example, the ground rail 602 and virtual voltage supply rail 604 may be fabricated using a lower level metal (e.g., M1), and the actual voltage supply rail 606, which may cross over the ground rail and/or the virtual voltage supply rail at periodic intervals, is preferably fabricated using a higher level metal (e.g., M2). Alternatively, ground rail 602 and virtual voltage supply rail 604 may be fabricated using a higher metal layer (e.g., M2) than the actual voltage supply rail 606. In either case, the actual voltage supply rail 606 will be electrically isolated from the ground rail 602 and virtual voltage supply rail 604.

The power switching cell 504 preferably includes at least one MOS switching device, such as PMOS device 610, having a source adapted for connection to the actual voltage supply rail 606 by way of one or more conductive vias 608, a drain connected to the virtual voltage supply rail 604, and a gate adapted for receiving a control signal, SLEEP, for selectively turning PMOS device 610 on and off. Device 610 functions primarily as a switch which connects the virtual voltage supply rail 604 to the actual voltage supply rail 606 during a first mode of operation of the logic cell 502, which may be a normal mode, and to disconnect the virtual voltage supply rail 604 from the actual voltage supply rail 606 during a second mode of operation, which may be a standby mode. Thus, in the illustrative power switching circuit 504, under normal operation of the logic cell 502 the control signal SLEEP will be a logic low ("0") level (e.g., inactive) and during a standby mode of operation, the control signal SLEEP will be a logic high ("1") level (e.g., active).

The power switching cell 504 is preferably located under at least a portion of the overlaying power grid, at an intersection of the actual voltage supply rail 606 and the virtual voltage supply rail 604. With the power switching cell 504 configured in this manner, electrical connection between the power switching cell and the actual voltage supply rail 606 can be made vertically, for example by way of conductive vias 608. By employing the techniques of the present invention, the need for an additional horizontal voltage supply rail in the IC is beneficially eliminated, thereby reducing the overall size of the IC device. Thus, by locating the power switching cell 302 substantially under the overlaying actual voltage supply rail 606 so as to permit the connection between the actual and virtual voltage supply rails to be made at an interface of overlapping conductive layers corresponding to the actual and virtual voltage supply rails, an MTCMOS circuit can be implemented using standard two-rail logic cell libraries. This area savings is advantageously carried throughout the entire logic cell library. Using this approach, the voltage supply rail in a two-rail logic cell will serve as the virtual voltage supply rail in a MTCMOS circuit implementation.

Although the techniques of the present invention have been described herein with reference to MTCMOS circuit layouts, it is to be understood that the power switching cell layout configuration can be utilized with essentially any substantially grid-based design application, wherein the overlaying voltage supply rails comprise conductive elements which intersect with one another (e.g., orthogonal, diagonal, etc.).

At least a portion of the power switching cell of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A power switching circuit for use in an integrated circuit including at least a first voltage rail and a second voltage rail, the power switching circuit comprising:
    at least one MOS device including a first source/drain physically configured to connect vertically to the first voltage rail, a second source/drain adapted for connection to the second voltage rail, and a gate adapted for receiving a control signal, the at least one MOS device selectively connecting the first voltage rail to the second voltage rail in response to the control signal;
    wherein the first and second voltage rails are physically configured to form a grid overlying the power switching circuit, the first and second voltage rails being formed in different vertical planes relative to one another, and wherein the connection between the power switching circuit and the first voltage rail is made at a physical intersection between the first and second voltage rails;
    wherein the first voltage rail comprises an actual ground rail and the second voltage rail comprises a virtual ground rail.

2. The power switching circuit of claim 1, wherein the first voltage rail is oriented orthogonally to the second voltage rail.

3. The power switching circuit of claim 1, wherein the first and second voltage rails are fabricated using different level conductive layers relative to one another.

4. The power switching circuit of claim 1, wherein the first and second voltage rails are electrically isolated from one another by at least one insulating layer.

5. The power switching circuit of claim 1, wherein the power switching circuit is configured for connection to logic circuitry formed in the integrated circuit and located in-line with the power switching circuit.

6. The power switching circuit of claim 1, further comprising a second MOS device including a first source/drain physically configured to connect vertically to a third voltage rail in the integrated circuit, a second source/drain adapted for connection to a fourth voltage rail in the integrated circuit, and a gate adapted for receiving a second control signal, the second MOS device selectively connecting the third voltage rail to the fourth voltage rail in response to the second control signal;
    wherein the third and fourth voltage rails are physically arranged in different vertical planes relative to one another, and wherein the connection between the power switching circuit and the third voltage rail is made at a physical intersection between the third and fourth voltage rails.

7. A multiple-threshold CMOS (MTCMOS) circuit, comprising:
    at least first, second and third voltage rails, the third voltage rail being physically arranged in a different vertical plane relative to the first and second voltage rails;
    logic circuitry connected between the first and second voltage rails; and
    a power switching circuit connected directly between the second and third voltage rails, the power switching circuit having an input adapted for receiving a control signal, the power switching circuit being operative to selectively connect the second voltage rail to the third voltage rail in response to the control signal;
    wherein a physical connection between the power switching circuit and the third voltage rail is made vertically and at an interface between the second and third voltage rails;
    wherein the second voltage rail comprises a virtual ground rail and the third voltage rail comprises an actual ground rail.

8. The MTCMOS circuit of claim 7, wherein the power switching circuit is located in-line with the logic circuitry.

9. The MTCMOS circuit of claim 7, wherein the second voltage rail is oriented orthogonally to the third voltage rail.

10. The MTCMOS circuit of claim 7, wherein the first voltage rail is oriented parallel to the second voltage rail.

11. The MTCMOS circuit of claim 7, wherein the first and second voltage rails are oriented orthogonally to the third voltage rail.

12. The MTCMOS circuit of claim 7, wherein the first, second and third voltage rails are formed in different planes relative to one another.

13. The MTCMOS circuit of claim 7, wherein the first, second and third voltage rails are fabricated using different level conductive layers relative to one another.

14. The MTCMOS circuit of claim 7, wherein the first, second and third voltage rails are electrically isolated from one another by at least one insulating layer between any two voltage rails.

15. An integrated circuit comprising at least one power switching circuit including at least a first voltage rail and a second voltage rail, the at least one power switching circuit comprising:

at least one MOS device including a first source/drain physically configured to connect vertically to the first voltage rail, a second source/drain adapted for connection to the second voltage rail, and a gate adapted for receiving a control signal, the at least one MOS device selectively connecting the first voltage rail to the second voltage rail in response to the control signal;

wherein the first and second voltage rails are physically configured to form a grid overlying the power switching circuit, the first and second voltage rails being formed in different vertical planes relative to one another, and wherein the connection between the power switching circuit and the first voltage rail is made at an interface between the first and second voltage rails;

wherein the first voltage rail comprises an actual ground rail and the second voltage rail comprises a virtual ground rail.

16. The integrated circuit of claim 15, wherein the power switching circuit is configured for connection to logic circuitry formed in the integrated circuit and located in-line with the power switching circuit.

17. The integrated circuit of claim 15, wherein the at least one power switching circuit further comprises:

a second MOS device including a first source/drain physically configured to connect vertically to a third voltage rail in the integrated circuit, a second source/drain adapted for connection to a fourth voltage rail in the integrated circuit, and a gate adapted for receiving a second control signal, the second MOS device selectively connecting the third voltage rail to the fourth voltage rail in response to the second control signal;

wherein the third and fourth voltage rails are physically arranged in different vertical planes relative to one another, and wherein the connection between the power switching circuit and the third voltage rail is made at a physical intersection between the third and fourth voltage rails.

\* \* \* \* \*